US012733513B2

(12) United States Patent
Tang et al.

(10) Patent No.: US 12,733,513 B2
(45) Date of Patent: Sep. 8, 2026

(54) JUMP-FUSING AND TAILORED PCB SYSTEM FOR LOOP INDUCTANCE REDUCTION

(71) Applicant: Texas Instruments Incorporated, Dallas, TX (US)

(72) Inventors: Yiqi Tang, Allen, TX (US); Rajen Murugan, Dallas, TX (US); Chittranjan Gupta, Richardson, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 1013 days.

(21) Appl. No.: 17/880,057

(22) Filed: Aug. 3, 2022

(65) Prior Publication Data

US 2024/0047316 A1 Feb. 8, 2024

(51) Int. Cl.

| | |
|---|---|
| ***H10W 70/40*** | (2026.01) |
| ***H05K 1/11*** | (2006.01) |
| ***H05K 1/181*** | (2026.01) |
| *H10W 72/00* | (2026.01) |
| *H10W 72/50* | (2026.01) |
| *H10W 74/10* | (2026.01) |
| *H10W 90/00* | (2026.01) |

(52) U.S. Cl.

CPC .......... *H10W 70/429* (2026.01); *H05K 1/115* (2013.01); *H05K 1/181* (2013.01); *H05K 2201/09227* (2013.01); *H05K 2201/10363* (2013.01); *H10W 70/417* (2026.01); *H10W 72/073* (2026.01); *H10W 72/075* (2026.01); *H10W 72/5449* (2026.01); *H10W 72/5473* (2026.01); *H10W 74/111* (2026.01); *H10W 90/736* (2026.01); *H10W 90/756* (2026.01)

(58) Field of Classification Search

CPC ... H01L 23/49555; H01L 24/48; H01L 24/49; H05K 1/115; H05K 1/181; H10W 70/429

See application file for complete search history.

(56) References Cited

U.S. PATENT DOCUMENTS 5,592,020 A * 1/1997 Nakao ............... H01L 23/49551 257/E23.047
5,648,681 A * 7/1997 Takashima .......... H01L 23/4951 257/E25.023
5,914,529 A * 6/1999 King ................. H01L 23/49541 361/813
5,977,619 A * 11/1999 Uemura ............ H01L 23/49568 257/676

(Continued)

*Primary Examiner* — Eugene Lee

(74) *Attorney, Agent, or Firm* — Ronald O. Neerings; Frank D. Cimino

(57) ABSTRACT

An electronic device includes conductive leads, a conductive crossbar, and first and second bond wires. The conductive leads are arranged in a row along a side of a package structure and include a conductive first lead, a conductive second lead, and a conductive third lead. The first and second leads are non-adjacent, the third lead is between the first and second leads in the row, and the crossbar electrically connects the first and second leads. The first bond wire electrically connects a first conductive feature of a semiconductor die to one of the crossbar, the first lead, and the second lead, and the second bond wire electrically connects a second conductive feature of the semiconductor die to the third lead.

20 Claims, 15 Drawing Sheets

(56) References Cited

U.S. PATENT DOCUMENTS

| | | | | |
|---|---|---|---|---|
| 6,121,674 | A * | 9/2000 | Corisis | H01L 24/49 257/676 |
| 6,133,624 | A * | 10/2000 | Asada | H01L 24/85 257/784 |
| 6,211,462 | B1 | 4/2001 | Carter, Jr. et al. | |
| 7,528,013 | B1 * | 5/2009 | Sutardja | H01L 23/49541 438/123 |
| 2003/0042583 | A1 * | 3/2003 | Chen | H01L 23/4334 257/E23.092 |
| 2005/0146058 | A1 * | 7/2005 | Danno | H01L 23/3107 257/796 |
| 2007/0034993 | A1 * | 2/2007 | Lange | H01L 24/06 257/666 |
| 2015/0137337 | A1 * | 5/2015 | Hsieh | H01L 23/49551 257/676 |
| 2016/0141230 | A1 * | 5/2016 | Liu | H01L 21/4825 257/670 |
| 2019/0006999 | A1 * | 1/2019 | Kim | H01L 23/66 |
| 2019/0229044 | A1 * | 7/2019 | Saiyajitara | H01L 23/49565 |
| 2020/0066716 | A1 | 2/2020 | Tang et al. | |
| 2020/0235042 | A1 * | 7/2020 | Bin Abdul Aziz | H01L 21/4842 |

* cited by examiner 100
103
104
105
106
108
110
111
112
113
114
118
120
121
122
123
125
130
132
140
141
142
143
X
Y 300
400
125
126
127
128
110
111
112
113
114
116
118
120
Y
X 500
300
125
126
127
128
110
111
112
113
114
116
118
120
121
122
123
124
X
Y 300
600
102
103
104
105
106
108
110
111
112
113
114
116
118
120
121
122
123
124
125
126
127
128
X
Y 100
700
120
125
126
127
128

JUMP-FUSING AND TAILORED PCB SYSTEM FOR LOOP INDUCTANCE REDUCTION

BACKGROUND

High inductance can adversely affect power delivery performance of electronic devices such as integrated circuits. Flat pack devices, such as quad flat pack (QFP) types, can suffer from high loop inductance of power supply and return connection and routing, especially for high di/dt operation of internal device circuitry. QFP inductance can be reduced using multi-bond wires or fusing lead frame pins, but these approaches are limited and can be difficult to maintain pin compatibility. Alternative solutions reduce chip performance to lower di/dt and/or reduce the package I/O count to fuse a block of package lead frames for reduced inductance.

SUMMARY

In one aspect, an electronic device includes conductive leads, a conductive crossbar, and bond wires, in which the conductive leads are arranged in a row along a side of a package structure. The conductive leads include a first lead, a second lead, and a third lead, where the first and second leads are non-adjacent in the row, and the third lead is between the first and second leads in the row. The conductive crossbar electrically connects the first and second leads. A first bond wire electrically connects a first conductive feature of a semiconductor die to one of the crossbar, the first lead, and the second lead, and a second bond wire electrically connects a second conductive feature of the semiconductor die to the third lead.

In another aspect, a method of fabricating an electronic device includes forming a first bond wire to connect a first conductive feature of a semiconductor die to one of a crossbar, a first lead, and a second lead of a lead frame having conductive leads with lead ends arranged in a row along a first direction, where the conductive leads include the first and second leads and a third lead between the first and second leads along the first direction, the crossbar is positioned along the first direction between the semiconductor die and the lead ends, and the crossbar extends along an orthogonal second direction to connect the first and second leads. The method also includes forming a second bond wire that electrically connects a second conductive feature of the semiconductor die to the third lead and forming a package structure that encloses the conductive crossbar, the first and second bond wires, and portions of the first, second, and third leads.

In a further aspect, a system includes an electronic device and a circuit board. The electronic device includes conductive leads, a conductive crossbar, and bond wires, in which the conductive leads are arranged in a row along a side of a package structure. The conductive leads include a first lead, a second lead, and a third lead, where the first and second leads are non-adjacent in the row, and the third lead is between the first and second leads in the row. The conductive crossbar electrically connects the first and second leads. A first bond wire electrically connects a first conductive feature of a semiconductor die to one of the crossbar, the first lead, and the second lead, and a second bond wire electrically connects a second conductive feature of the semiconductor die to the third lead. The circuit board has a substrate with a first side to which the electronic device is mounted, and an opposite second side and the circuit board includes first and second conductive trace layers and conductive vias. The conductive first trace layer on the first side of the substrate includes a base trace, a first trace, a second trace, and a third trace. The base trace extends under the semiconductor die, the first trace extends along the first side under the first lead, the second trace extends under the second lead, and the third trace extends under the conductive crossbar and joining the first and second traces. The conductive second trace layer on the second side of the substrate extends under the base trace, the first trace, the second trace, and the third trace, and the conductive vias extend between and electrically connect the second trace layer to the base trace, the first trace, the second trace, and the third trace of the first trace layer.

DETAILED DESCRIPTION

Figure 1:
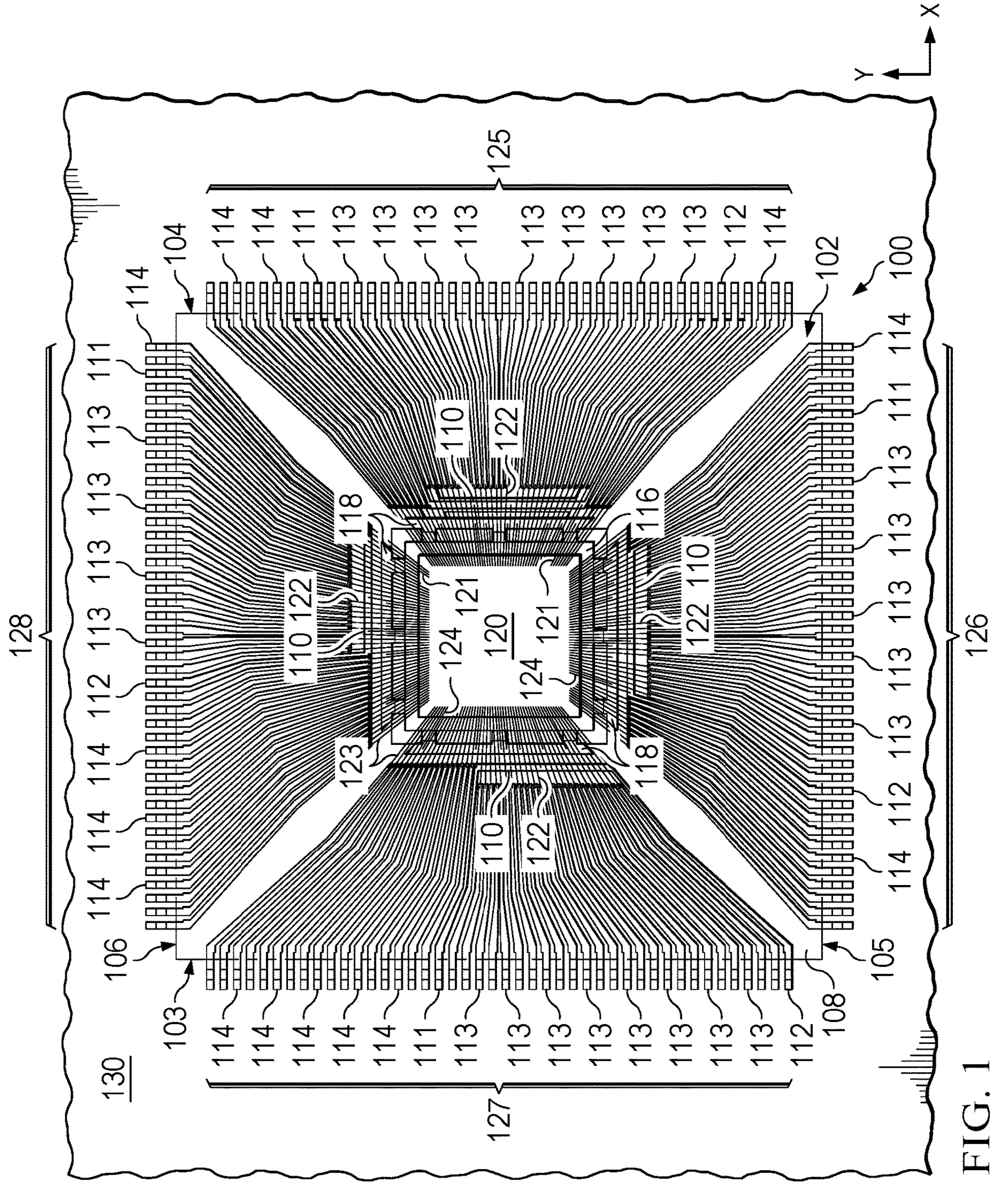
FIG. 1 is a partial top plan view of a system including an electronic device with crossbar's connecting non-adjacent leads along four lateral sides and a circuit board with underlying trace features.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
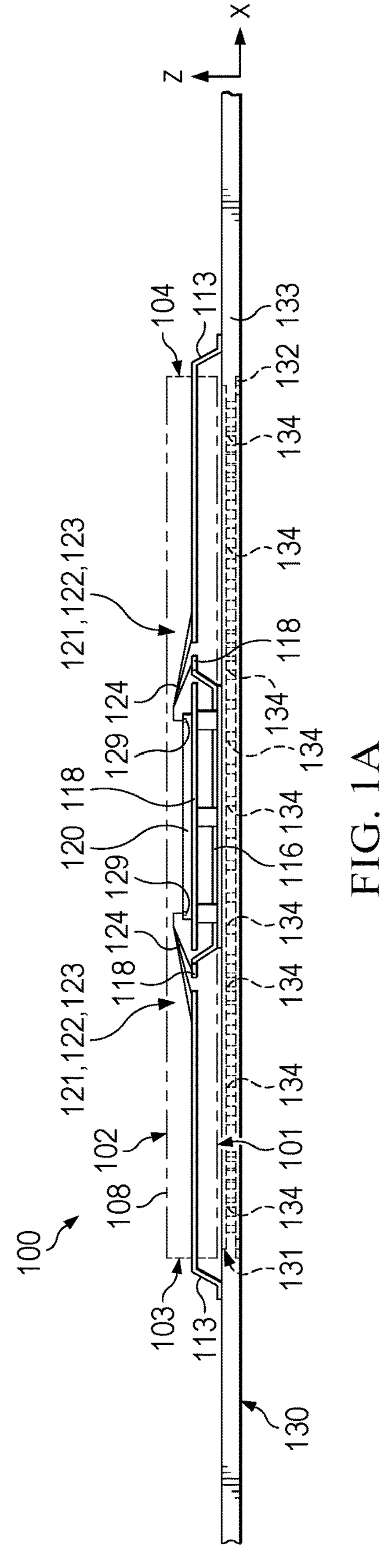
FIG. 1A a is a partial sectional side elevation view of the system of FIG. 1.
Figure 1B:
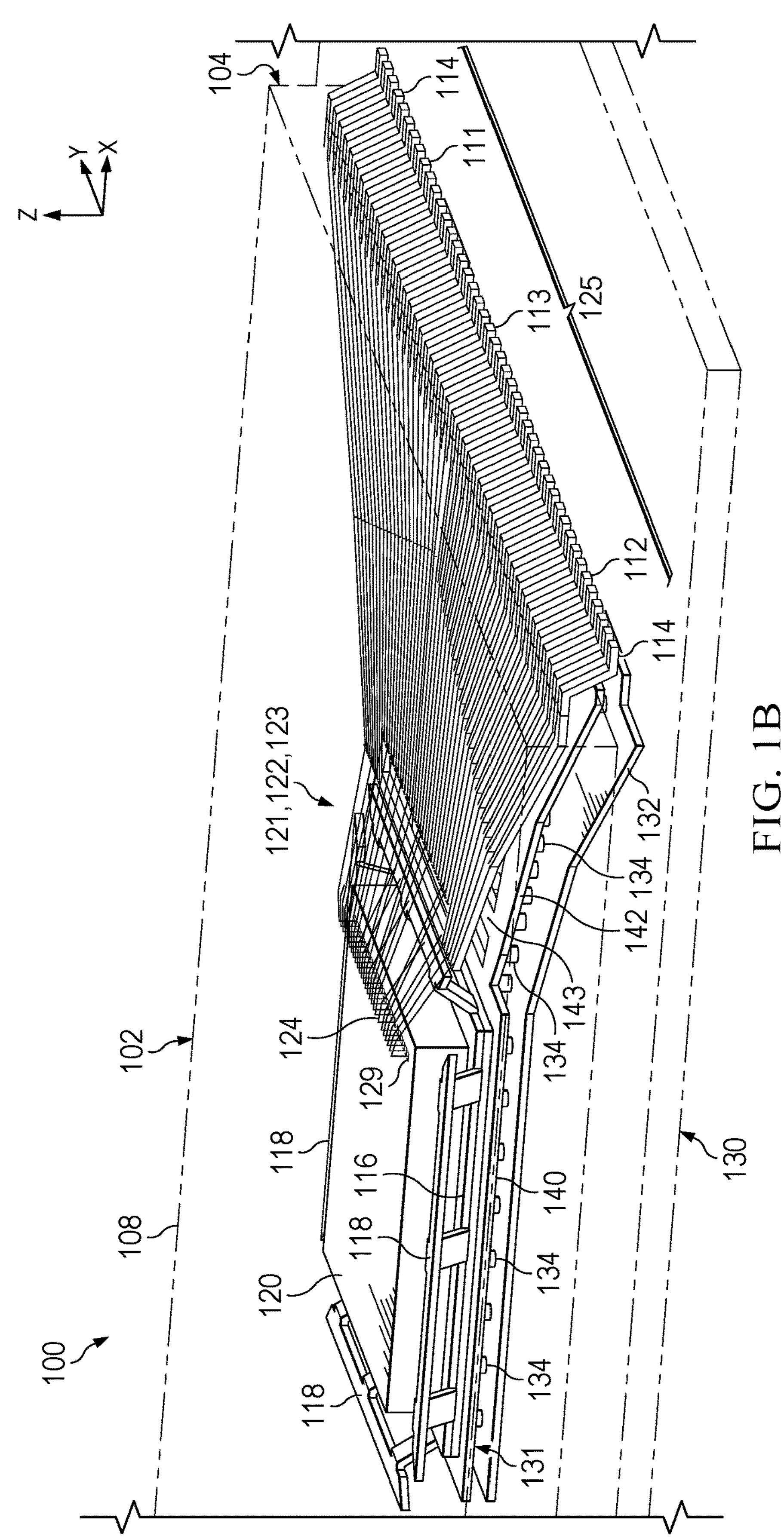
FIG. 1B is a partial top perspective view showing details of leads, a crossbar, jumper wire bond connections, underlying circuit board trace features for one quadrant along one side of the electronic device in FIG. 1.
Figure 1C:
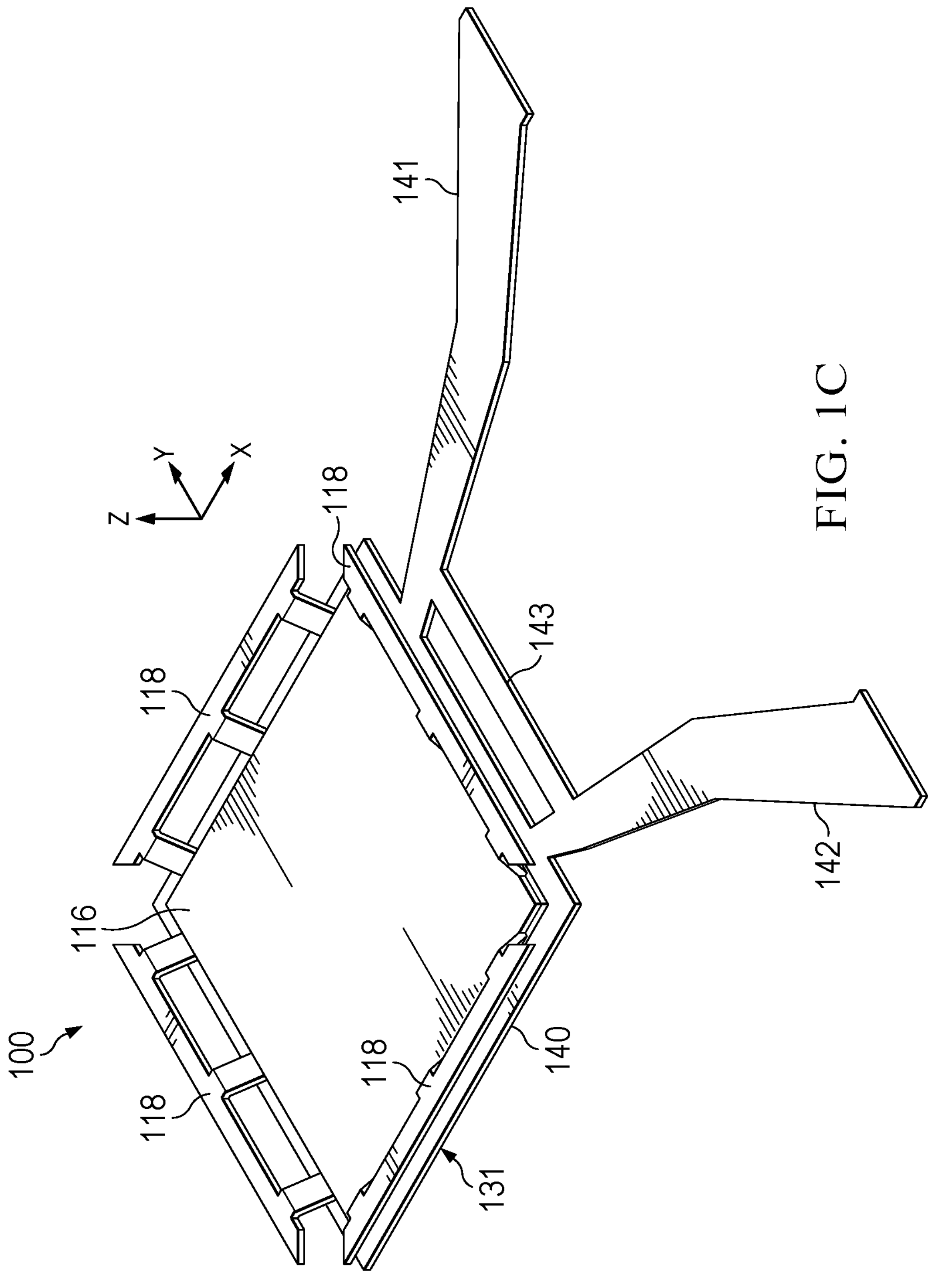
FIG. 1C is a partial top perspective view of a die attach portion of the electronic device and one example row of conductive leads of the electronic device as well as trace features of a first circuit board trace layer in the system of FIG. 1.
Figure 1D:
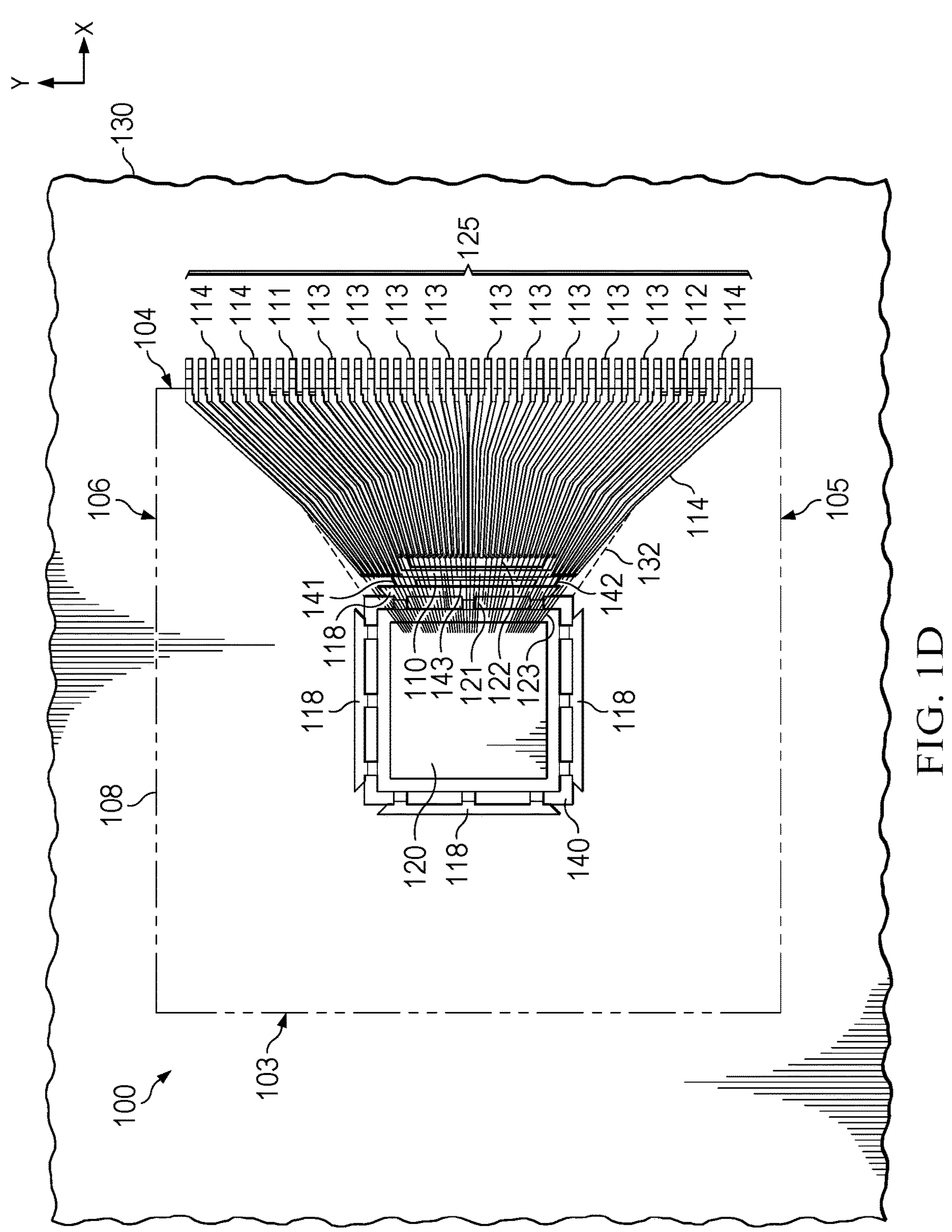
FIG. 1D is a partial top plan view of a die attach pad and conductive leads of one quadrant of the electronic device above conductive features of the first circuit board trace layer in the system of FIG. 1.

FIGS. 1-1D show a system including an electronic device 100 with crossbars connecting non-adjacent leads along four lateral sides and a circuit board with underlying conductive features in first and second trace layers that correspond to non-adjacent first and second leads and the crossbar of the four sides in first and second circuit board trace layers to reduce loop inductance and improve power delivery. The system is shown in FIGS. 1-1D in an example three-dimensional space with a first direction X, and a perpendicular second direction Y, and a third direction Z that is perpendicular to the respective first and second directions X and Y, and structures or features along any two of these directions are orthogonal to one another.

The electronic device 100 has a molded or ceramic package structure 108 that includes a first side 101 (e.g., a bottom side shown in FIG. 1A), a second side 102 (e.g., a top side), a lateral third side 103, a lateral fourth side 104, a lateral fifth side 105, and a lateral sixth side 106. The respective third and fourth sides 103 and 104 are spaced apart from one another along the first direction X in the illustrated device orientation, and the lateral fifth and sixth sides 105 and 106 are spaced apart from one another along the second direction Y. In addition, the first and second sides 101 and 102 are spaced apart from one another along the third direction Z. The first side 101 electronic device 100 is mounted to a top side of a circuit board 130 (e.g., a multilayer printed circuit board or PCB), a portion of which is shown in FIG. 1, and conductive leads of the electronic device 100 are soldered for electrical connection to conductive circuit board pads (not shown) of the circuit board 130.

The system including the electronic device 100 and the circuit board 130 combines tailored circuit board conductive trace features and electronic device jump-fusing with non-adjacent leads having crossbar interconnections to facilitate low loop inductance of power supply and return connections to the electronic device 100 and operation of the system. This approach provides a solution without reducing device power delivery and allowing high di/dt operation while facilitating pin compatibility of the electronic device 100 with existing circuit board design layouts. In addition, the illustrated examples provide inductance reduction without requiring multi-bond wires or fusing lead frame pins, and do not add cost or complexity to the electronic device 100 or the device or system fabrication processes. In addition, the illustrated examples provide these benefits without impacting the I/O count. The example electronic device 100 has a 176 pin QFN package form with 44 conductive leads or pins along each of the lateral sides 103, 104, 105, and 106. In other examples, different numbers of leads can be provided on different lateral sides, and some sides need not have any leads. In other implementations, different package forms and types can be used, such as quad flat no-lead packages (e.g., QFN, not shown) with leads along one or more lateral sides. In addition, the illustrated example has a die attach pad to which a semiconductor die is mounted, and a bottom side of the die attach pad is exposed to the outside of the molded package structure 108, for example, to allow soldering to a conductive feature of the circuit board 130. In other examples (not shown), the bottom side of the die attach pad is not exposed for external soldering.

As seen in FIG. 1, the electronic device 100 has conductive leads 111-114 along each of the lateral sides of 103-106, and the electronic device 100 includes crossbars 110 parallel to respective ones of the lateral sides 103-106. The individual crossbars 110 extend between, and provide electrical and mechanical connection of, respective first and second leads 111 and 112 along each of the lateral sides 103-106. FIGS. 1B-1D show lead and bond wire details for only one quadrant of the electronic device 100 and corresponding trace features of the circuit board 130.

As further shown in FIGS. 1-1D, the electronic device 100 includes a die attach pad 116 that can provide a circuit ground or voltage reference, and the die attach pad 116 is connected by three ramped metal bars to a corresponding reference connection bar 118 in the individual quadrants associated with the respective sides 103-106. A semiconductor die 120 (FIGS. 1, 1A and 1D) is attached to a top surface of the die attach pad 116, for example, using die attach adhesive (not shown). The semiconductor die 120 includes conductive features 129 (e.g., FIGS. 1A and 1B), such as copper or aluminum bond pads or metal pillars structures that allow electrical connection to respective ones of the leads 111-114 using bond wires 121-124 (FIGS. 1, 1A, 1B and 1D). As shown in FIG. 1, moreover, the conductive leads 111-114 along each respective lateral side 103-106 of the package structure 108 are arranged in a corresponding row, with lead ends of the respective leads 111-114 exposed outside the respective package sides 103-106. The fourth side 104 of the package structure 108 in FIG. 1 includes a first row 125 of respective leads 111-114 along the side 104. The fifth side 105 has a row 126 of respective leads 111-114, the third side 103 has a row 127 of respective leads 111-114, and the sixth side 106 has a row 128 of respective leads 111-114 as shown in FIG. 1. FIGS. 1B and 1D show only one quadrant of the electronic device 100 with the first row 125 of leads 111-114 along the fourth side 104 of the package structure 108.

In the illustrated example, the conductive leads 111-114 are arranged in the example row 125 along the fourth side 104 of the package structure 108 and include a conductive first lead 111, a conductive second lead 112. The respective first and second leads 111 and 112 are non-adjacent in the row 125, and one or more conductive third leads 113 are located between the first and second leads 111 and 112 in the row 125. A conductive crossbar 110 extends between and electrically connects the respective first and second leads 111 and 112 along the first row 125. In addition, conductive fourth leads 114 in the row 125 are outward of the first or second leads. In the illustrated example, the first row 125 has multiple instances of the fourth lead 114 between the first lead 111 and one end of the first row 125, with the first lead 111 between the third lead 113 and the fourth lead 114 in the row 125. The first row 125 also includes further instances of the fourth lead 114 between the second lead 112 and the other end of the first row 125, with the second lead 112 between the third and fourth leads 113 and 114 along the first row 125.

The third, fifth, and sixth sides 103, 105, and 106 also include corresponding rows 127, 126, and 128, respectively, each including conductive leads 111-114 with non-adjacent first and second leads 111 and 112 connected by a corresponding crossbar 110. The rows 126-128 each include multiple third leads 113 located between the respective first and second leads 111 and 112, and the rows 126 and 128 have multiple fourth leads 114 outward of the first and second leads 111 and 112. The row 127 along the third side 103 has the second lead 112 at the lower end of the row 127 and multiple instances of the fourth lead 114 between the first lead 111 and the upper end of the row 127. In other implementations, fewer than all the sides have rows of leads with non-adjacent first and second leads connected by a crossbar. In these or other examples, the sides having rows of leads with non-adjacent first and second leads 111 and 112 connected by a crossbar 110 include one or more instances of the third lead 113 located between the respective first and second leads 111 and 112.

In the above or other examples, one or more of the sides having rows of leads with non-adjacent first and second leads 111 and 112 connected by a crossbar 110 include one or more instances of the fourth lead 114 laterally outward from one or both of the first and second leads 111 and 112 along the corresponding row. In various implementations, one or both of the first and second leads 111 and 112 can be at respective ends of the corresponding row (e.g., the row 127 in FIG. 1 having the second lead 112 at the lower and of the row). In this regard, one or more sides of the electronic device in certain examples can include a row with the first lead 111 at one end and the second lead 112 at the other end of the corresponding row, with no instances of the fourth lead 114 for one or more of the lateral sides 103-106 of the electronic device 100.

In these or other examples, moreover, one or more of the sides having rows of the leads 111-114 can include two or more pairs of non-adjacent crossbar-connected first and second leads 111 and 112 with at least one intervening instance of the third lead 113 between the first and second leads 111 and 112 and may include one or more instances of the fourth lead 114 laterally outward from the non-adjacent crossbar-connected first and second leads 111 and 112. For example, power and ground connections can be provided on a single side of the electronic device 100, each using a pair of non-adjacent crossbar-connected first and second leads 111 and 112 to reduce inductance associated with high di/dt power supply connections between the electronic device 100 and the circuit board 130.

Conductive features (e.g., metal bond pads) of the semiconductor die 120 are electrically connected to one or more of the leads 111-114, as well as to one or more of the reference connection bars 118. The electronic device 100 includes conductive bond wires 121-124 to form the electrical connections to the conductive features of the semiconductor die 120. As best shown in FIGS. 1 and 1D, each quadrant in the illustrated example includes one or more instances of a first bond wire 121 that electrically connects a first conductive feature of the semiconductor die 120 to a corresponding one of the crossbars 110 to form an electrical connection to that crossbar 110 and the connected first and second leads 111 and 112. The electronic device 100 of FIGS. 1-1D includes multiple instances of the first bond wire 121 in each quadrant that electrically connect corresponding conductive features of the semiconductor die 120 to the corresponding crossbar 110 of that quadrant. In this or another example, one or more of the instances of the first bond wire 121 can be connected directly to one of the first and second leads 111 and 112 in a given one of the quadrants to form an electrical connection from the corresponding conductive feature of the semiconductor die 120, the corresponding crossbar 110, and the corresponding leads 111 and 112.

In the illustrated implementation, for at least one quadrant, the first and second leads 111 and 112, the corresponding connected crossbar 110 and the connected conductive feature of the semiconductor die 120 are connected to a power supply return lines (e.g., ground or other reference node) of the circuitry of the circuit board 130 and of the semiconductor die 120. The first and second leads 111 and 112 and the connected crossbar 110 of another quadrant in one example are electrically connected to a supply voltage line (e.g., VDD, not shown) of the circuit board 130 and of the semiconductor die 120. In practice, the non-adjacent crossbar-connected first and second leads 111 and 112 facilitate reduced loop inductance in the system and the electronic device 100 itself, particularly for supply and supply return lines or other circuit nodes with high di/dt during powered operation of the system.

The conductive crossbar 110 of the first quadrant is positioned along the first direction X between the semiconductor die 120 and the fourth side 104 of the package structure 108, and the conductive crossbar 110 extends along the second direction Y from the first lead 111 to the second lead 112 in the package structure 108. As further shown in FIG. 1, the crossbar 110 of the quadrant having the row 127 of leads 111-114 along the third side 103 is positioned between the semiconductor die 120 and the third side 103 along the first direction X, and extends between inner ends of the corresponding first and second leads 111 and 112 along the second direction Y. The conductive crossbars 110 of the quadrants associated with the fifth and sixth sides 105 and 106 are similarly constructed and positioned, extending between the semiconductor die 120 and the respective fifth and sixth sides 105 and 106 along the second direction Y, and extending between the corresponding first and second leads 111 and 112 along the first direction X. The instances of the first bond wire 121 extend over (e.g., above) the corresponding intervening reference connection bar 118, and the instances of the first bond wire 121 are spaced apart from, and not electrically connected to, the corresponding reference connection bar 118.

The individual quadrants of the electronic device 100 shown in FIG. 1 also include one or more instances of a second bond wire 122 that electrically connects a second conductive feature of the semiconductor die 120 to the third lead 113. In one example, the second bond wire 122 of the respective quadrant extends over the corresponding conductive crossbar 110, for example, to form a jump-fuse structure. The second bond wire instances 122 in this example also extend over the corresponding reference connection bar 118 in the respective quadrants, and the second bond wires 122 are spaced apart from and not electrically connected to the corresponding crossbar 110 or the corresponding reference connection bar 118. In the illustrated example, the electronic device 100 includes multiple instances of the second bond wire 122 in order to provide electrical connection, such as I/O connections, etc. between various conductive features of the semiconductor die 120 and the respective instances of the third lead 113. The individual quadrants of the electronic device 100 in this example also include multiple instances of a third bond wire 123 that electrically connects further (e.g., third) conductive features of the semiconductor die 120 to the respective instances of the fourth lead 114.

As further shown in FIGS. 1A-1D, the circuit board 130 has a substrate 133 with an upper or first side to which the electronic device 100 is mounted, and an opposite lower or second side. In one example, the circuit board substrate 133 is or includes fire retardant insulator or dielectric material and can provide one or more conductive trace layers patterned with lines and other conductive traces or features. The illustrated circuit board 130 is a two level or two layer structure having an upper or first trace layer 131 on the first side of the substrate 133, a conductive second trace layer 132 on the second side of the substrate 133, and conductive vias 134 that extend between the first and second trace layers 131 and 132 and provide electrical connections according to a given design. In the illustrated example, the trace layers 131 and 132, the pattern features thereof, and the vias 134 are or include a conductive metal, such as aluminum or copper.

The first trace layer 131 includes a base trace 140 that extends under the semiconductor die 120. In one example, the die attach pad 116 of the electronic device 100 is soldered to the base trace 140. In another example, the base trace 140 extends under the semiconductor die 120 and under at least a portion of the die attach pad 116 but the base trace 140 need not be soldered to the die attach pad 116. In the illustrated example, the die attach pad 116 is electrically connected to the reference connection bars 118, which can be electrically connected (e.g., by corresponding instances of the fourth bond wires 124) to corresponding conductive features of the semiconductor die 120, such as aground or reference node. In one example, the die attach pad 116, the reference connection bars 118, and the first trace layer 131 are electrically connected to a system power supply (not shown) to operate as a supply return path for power supply current during powered operation of the system.

The first trace layer 131 also includes a first trace 141, a second trace 142, and a third trace 143. FIGS. 1B and 1D provide perspective and top views showing the relationship of the traces 141-143 of the circuit board 130 and the conductive leads 111-114 of an example quadrant of the electronic device. In one example, the other quadrants of the electronic device 100 and the circuit board 130 have similar trace structures 141-143 (not shown). In addition, FIG. 1C provides a partial view illustrating the example structure of the base trace 140 and the trace structures 141-143 for the illustrated quadrant. The first trace 141 extends along the first side of the substrate 133 under the first lead 111 in each respective quadrant. In the illustrated example, the first trace 141 is wider than the overlying first lead 111 as shown in FIG. 1D, although not a requirement of all possible implementations. In another example, the first trace 141 has a width approximately equal to the width of the first lead 111 and is approximately aligned therewith and directly under the first lead 111 (e.g., along the third direction Z in the illustrated orientation). In a further example, the first trace 141 can be narrower than the overlying first lead 111, and at least a portion of the first trace 141 is aligned with and directly under a portion of the first lead 111. In various implementations, at least a portion of the first trace 141 extends directly under at least a portion of the first lead 111 (e.g., along the third direction Z in the illustrated orientation).

The second trace 142 of each respective quadrant in this example has a corresponding structure relative to the second lead 112, in which at least a portion of the second trace 142 extends directly under at least a portion of the second lead 112. In the illustrated example, the second trace 142 of the circuit board 130 is wider than the overlying second lead 112 of the electronic device 100. Various implementations are possible, for example, in which the second trace 142 is wider than the overlying second lead 112 as shown in FIG. 1D, or the second trace 142 can have a width approximately equal to the width of the second lead 112 and is approximately aligned therewith and directly under at least a portion of the second lead 112. In a further example, the second trace 142 can be narrower than the overlying second lead 112, and at least a portion of the second trace 142 is aligned with and directly under a portion of the second lead 112. In various implementations, at least a portion of the second trace 142 extends directly under at least a portion of the second lead 112 (e.g., along the third direction Z in the illustrated orientation).

The third trace 143 in each quadrant of the example electronic device 100 extends at least partially under at least a portion of the conductive crossbar 110, and the third trace 143 extends between and joins the first and second traces 141 and 142. As shown in FIG. 1D, the example 3$^{rd}$ trace 143 is wider than the overlying conductive crossbar 110. In other implementations, the third trace 143 is approximately the same width as the corresponding crossbar 110, or the third trace 143 can be narrower than the crossbar 110, with at least a portion of the third trace 143 extending directly under at least a portion of the corresponding crossbar 110 (e.g., along the third direction Z in the illustrated orientation).

The conductive second trace layer 132 of the circuit board 130 extends on the lower or second side of the substrate 133 as best shown in FIGS. 1A, 1B and 1D. The second trace layer 132 in this example forms a continuous conductive metal structure that extends under the base trace 140, the first trace 141, the second trace 142, and the third trace 143. As seen in FIGS. 1B and 1D, the second trace layer 132 extends along the second direction Y beyond the Y-direction extent of the first and second traces 141 and 142, and the second trace layer 132 extends under the entire row of the leads 111-114. In addition, the second trace layer 132 also extends under the base trace 140 and provides a generally continuous structure under the semiconductor die 120, the die attach pad 116, and the leads of all the quadrants in the illustrated example. As best shown in FIGS. 1A and 1B (as well as in FIGS. 8 and 9 below), the conductive vias 134 extend between the second trace layer 132 to the base trace 140, the first trace 141, the second trace 142, and the third trace 143 of the first trace layer 131, and the vias 134 electrically connect these features of the respective first and second trace layers 131 and 132.

Referring also to FIGS. 2-7, FIG. 2 shows a method 200 of fabricating an electronic device and the method 200 is described below in connection with FIGS. 3-7 for one example of the electronic device 100 undergoing fabrication processing. At 202 in FIG. 2 in one example includes fabricating a lead frame panel array with non-adjacent leads connected by a crossbar.

Figure 3:
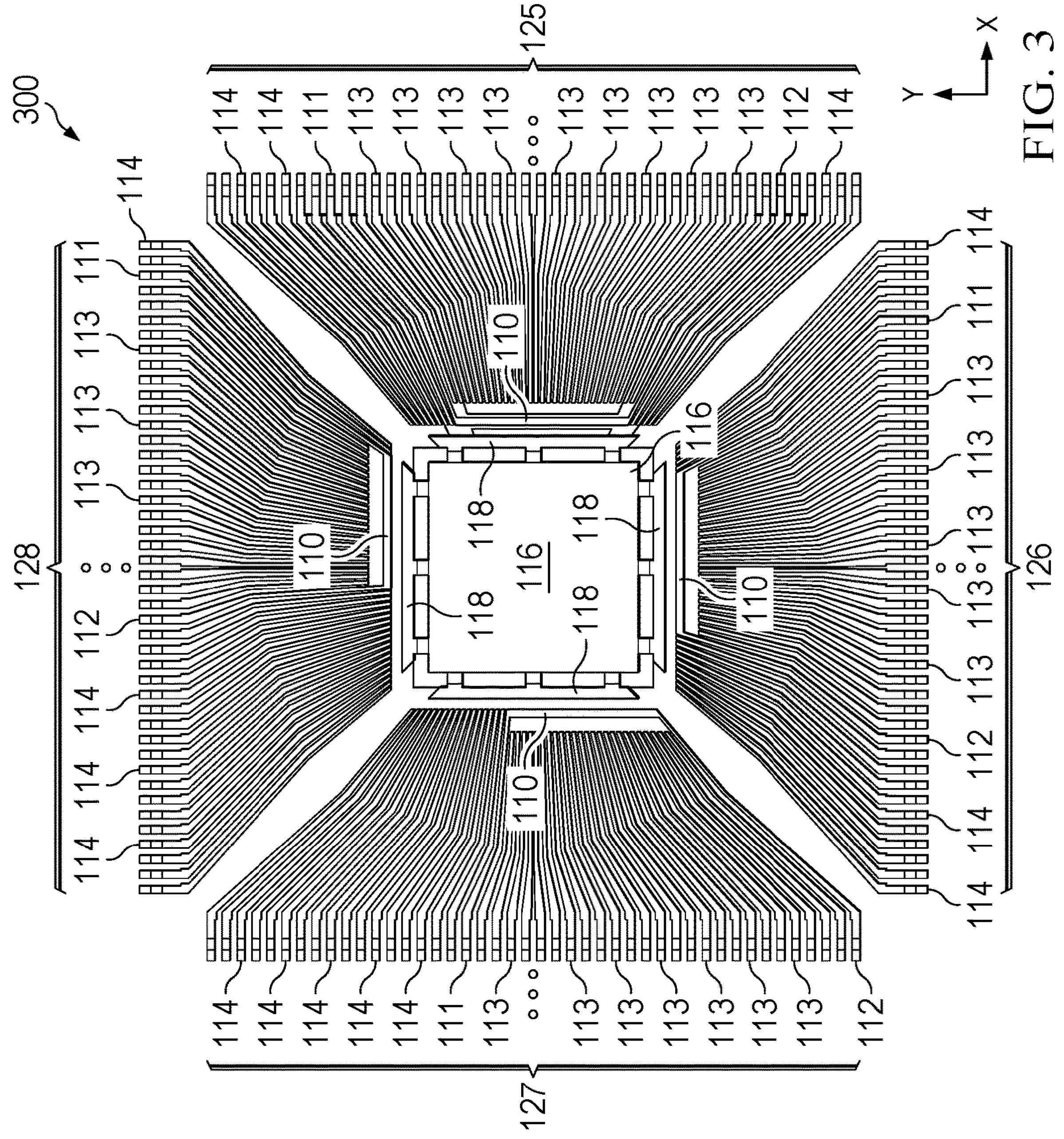
FIGS. 3-7 are partial top plan views of the electronic device of FIGS. 1-1D undergoing fabrication processing according to the method of FIG. 2.

FIG. 3 shows one example of a portion of a conductive metal (e.g., copper or aluminum) lead frame panel array 300 (e.g., a lead frame) that includes rows and columns of unit regions, one of which is shown in FIG. 3. The illustrated unit region of the lead frame panel array 300 includes the die attach pad 116 with ramped connections to the reference connection bar 118 of each of four quadrants, as well as the conductive leads 111-114 and four crossbars 110 connected between respective pairs of the first and second leads 111 and 112 for each of the four rows 125-128 of the leads 111-114 as described above. Prior to subsequent device separation, the leads of adjacent unit regions are connected to one another.

Figure 2:
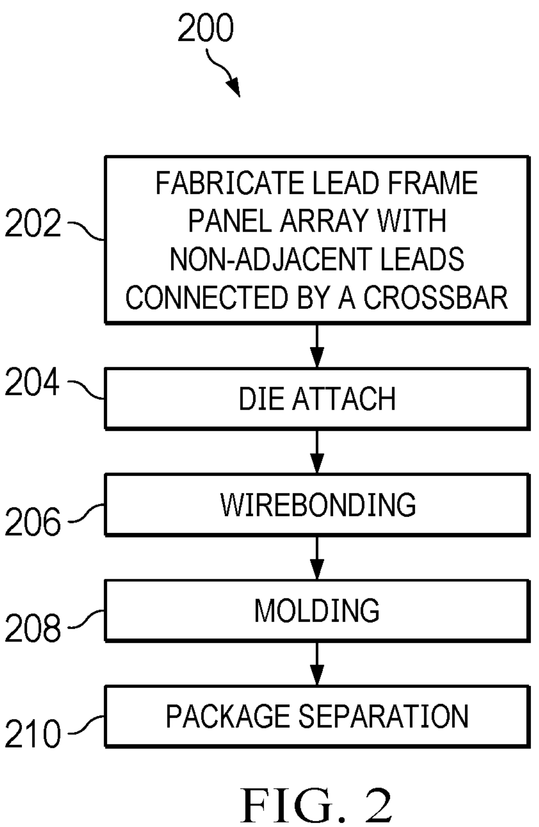
FIG. 2 is a flow diagram illustrating a method of fabricating an electronic device.
Figure 4:
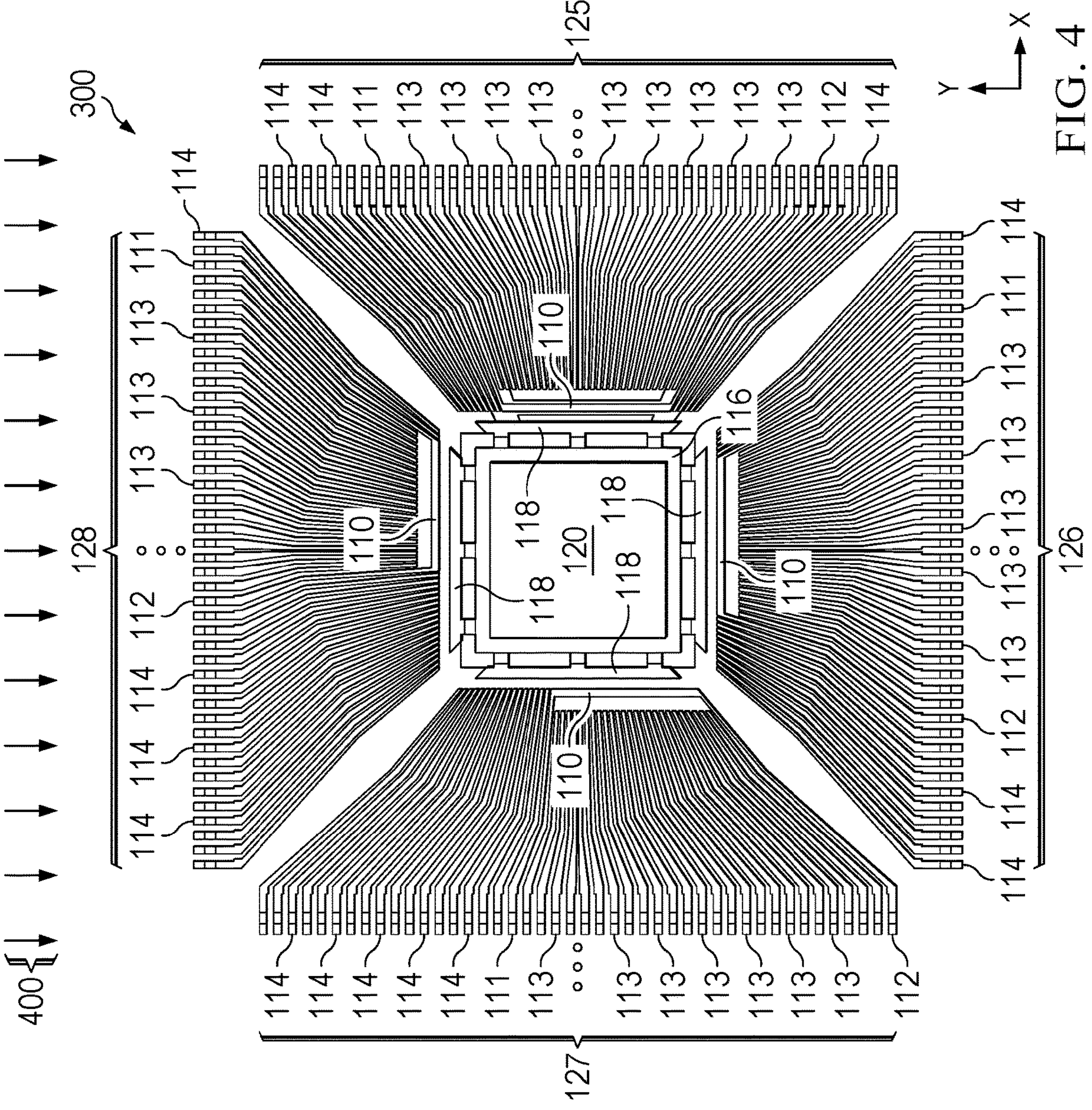

At 204 and FIG. 2, the method 200 includes die attach processing. FIG. 4 shows one example, in which a die attach process 400 is performed that attaches the semiconductor die 120 to the top side of the die attach pad 116. In one implementation, the die attach process 400 includes dispensing an adhesive on a portion of the top side of the die attach pad 116 in each unit region, pick and place or other automated attachment of the semiconductor die 120 on the adhesive in each unit region of the lead frame panel array 300, and a thermal heating process to cure the die attach adhesive.

Figure 5:
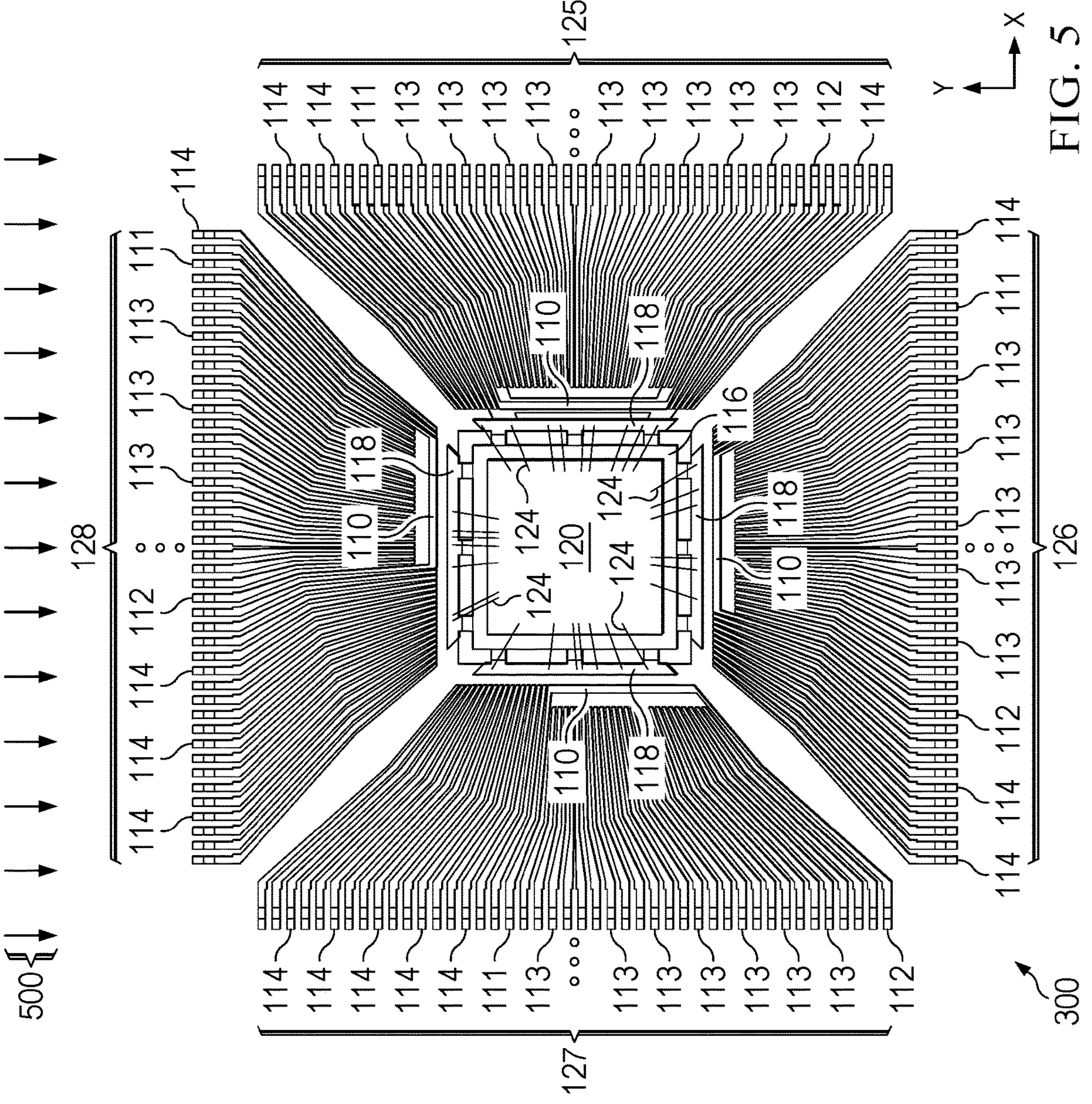
Figure 5A:
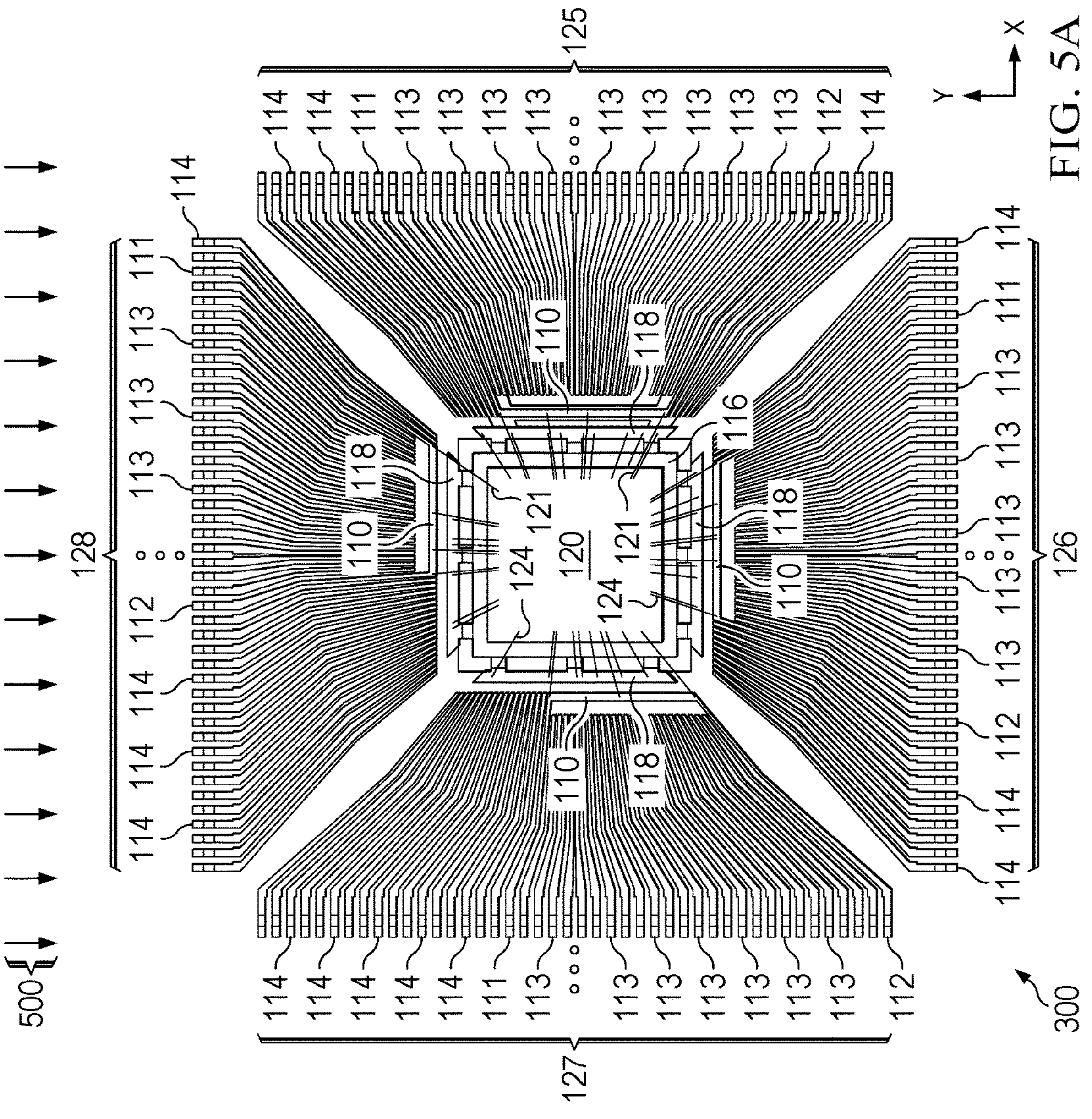
Figure 5B:
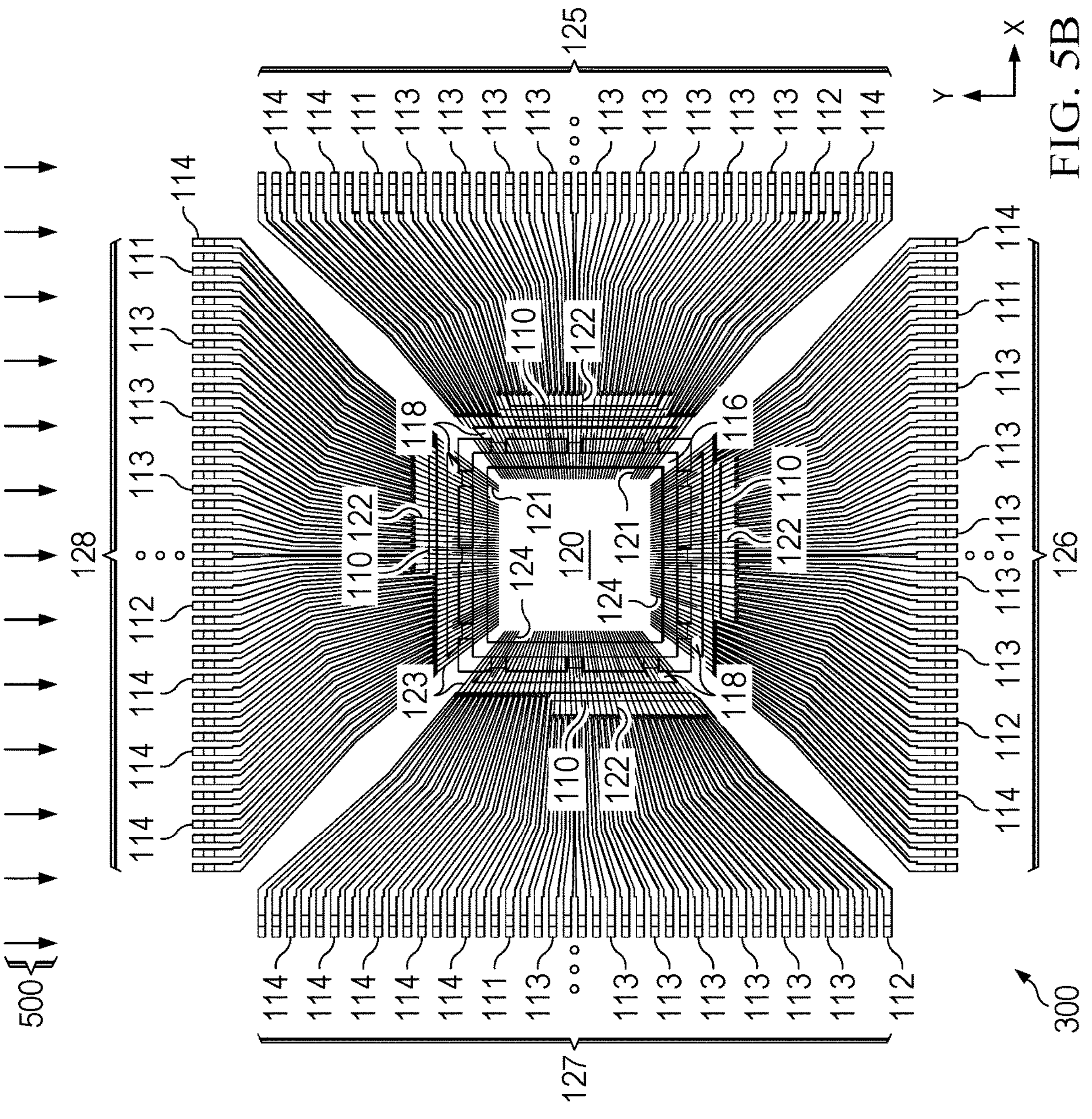

The method 200 continues at 206 in FIG. 2 with electrical connection processing to form electrical interconnections between the conductive features of the attached semiconductor die 120 and the conductive features of the lead frame panel array 300 in each unit region. The illustrated example includes wire bonding at 206 to form the bond wires 121-124 as described above. FIGS. 5-5B show one example, in which a wire bonding process 500 is performed that forms the bond wires 121-124 in the four quadrants of each unit region of the lead frame panel array 300. In FIG. 5, the fourth bond wires 124 are formed between the respective reference connection bars 118 and corresponding conductive features of the semiconductor die 120, for example, to electrically connect a ground or circuit reference node of the semiconductor die 120 to the die attach pad 116 in each unit area of the lead frame panel array 300. The wire bonding process 500 in this example continues in FIG. 5A with formation of the first bond wires 121 from respective conductive features of the semiconductor die 120 to the crossbars 110 of the corresponding quadrants in each of the unit areas of the lead frame panel array 300, where the first bond wires 121 are formed over (e.g., spaced apart from and above) the respective reference connection bars 118 for each quadrant.

The wire bonding process 500 continues as shown in FIG. 5B to form the second and third bond wires 122 and 124. In this example, the second bond wires 122 are formed over (e.g., spaced apart from and above) the respective reference connection bars 118 and conductive crossbars 110 for each quadrant in each unit area of the lead frame panel array 300.

Figure 6:
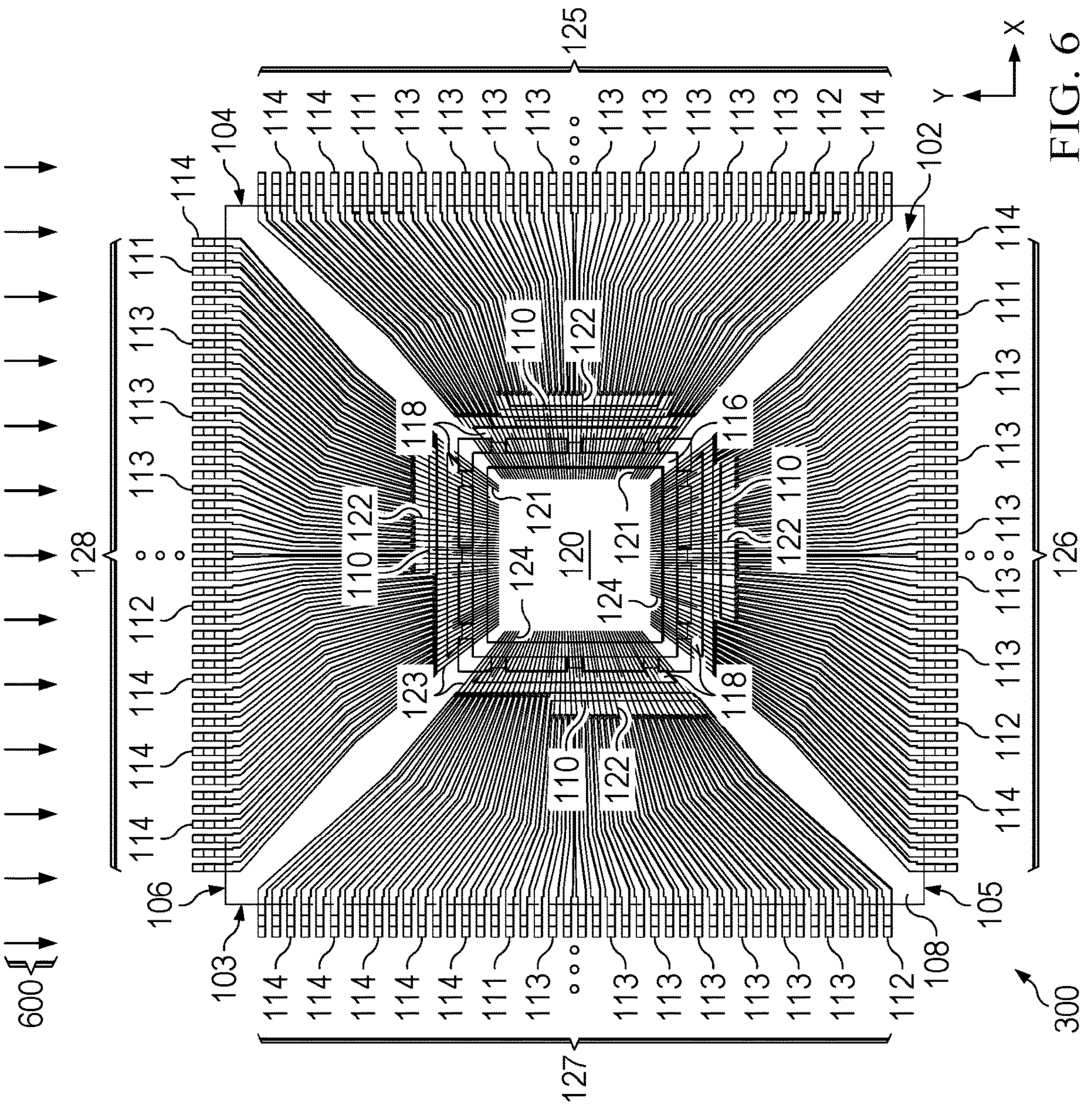

The method 200 continues at 208 in FIG. 2 with package formation to form the package structure 108. FIG. 6 shows one example, in which a molding process 600 is performed that forms the package structure 108 that encloses the conductive crossbars 110, the bond wires 121-124, and portions of the conductive leads 111-114, and which leaves ends of the leads 111-114 exposed.

Figure 7:
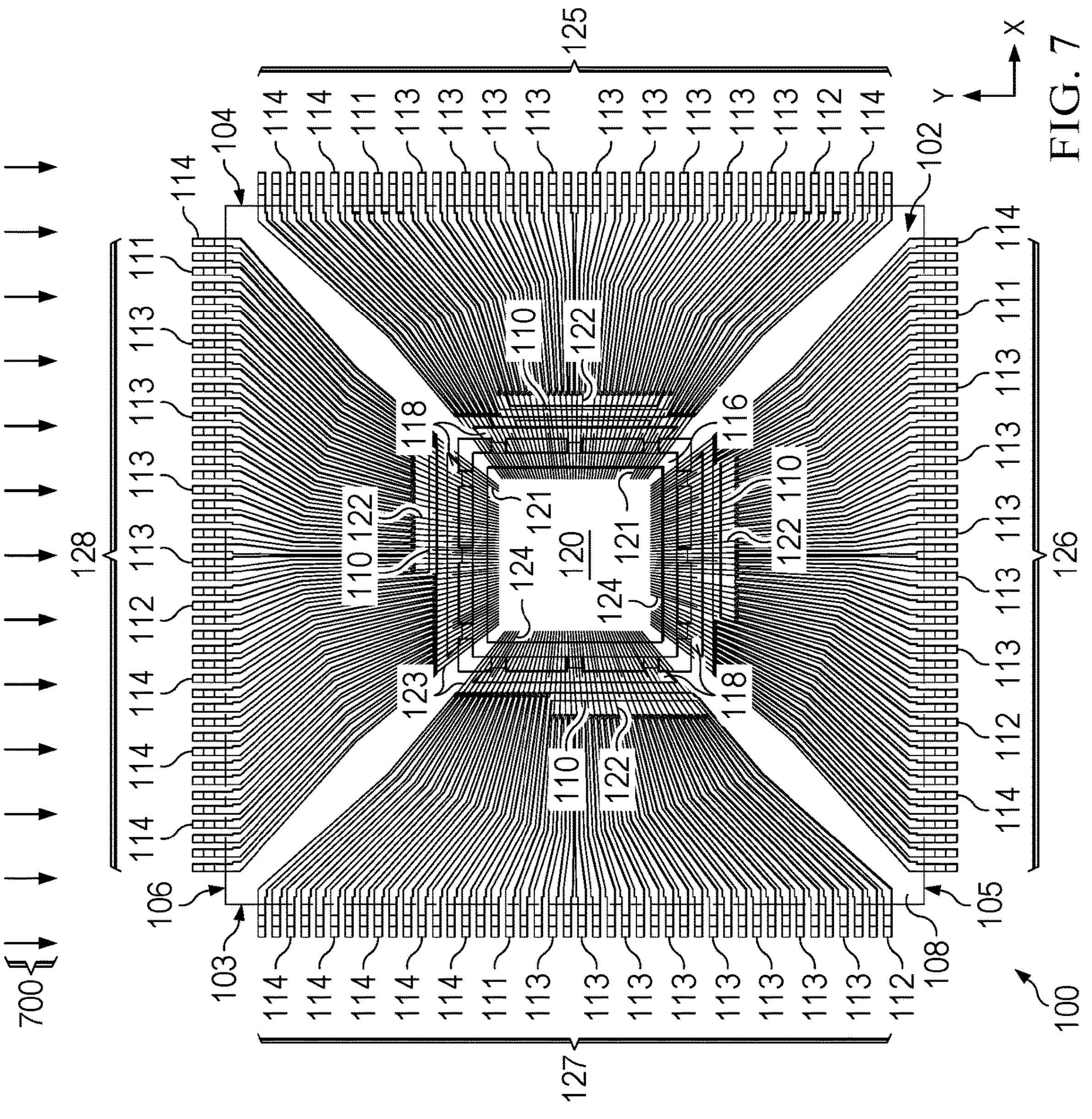

The method 200 also includes package separation at 210 in FIG. 2. FIG. 7 shows one example, in which the individual packaged electronic devices 100 are separated from the starting lead frame panel array.

Figure 8:
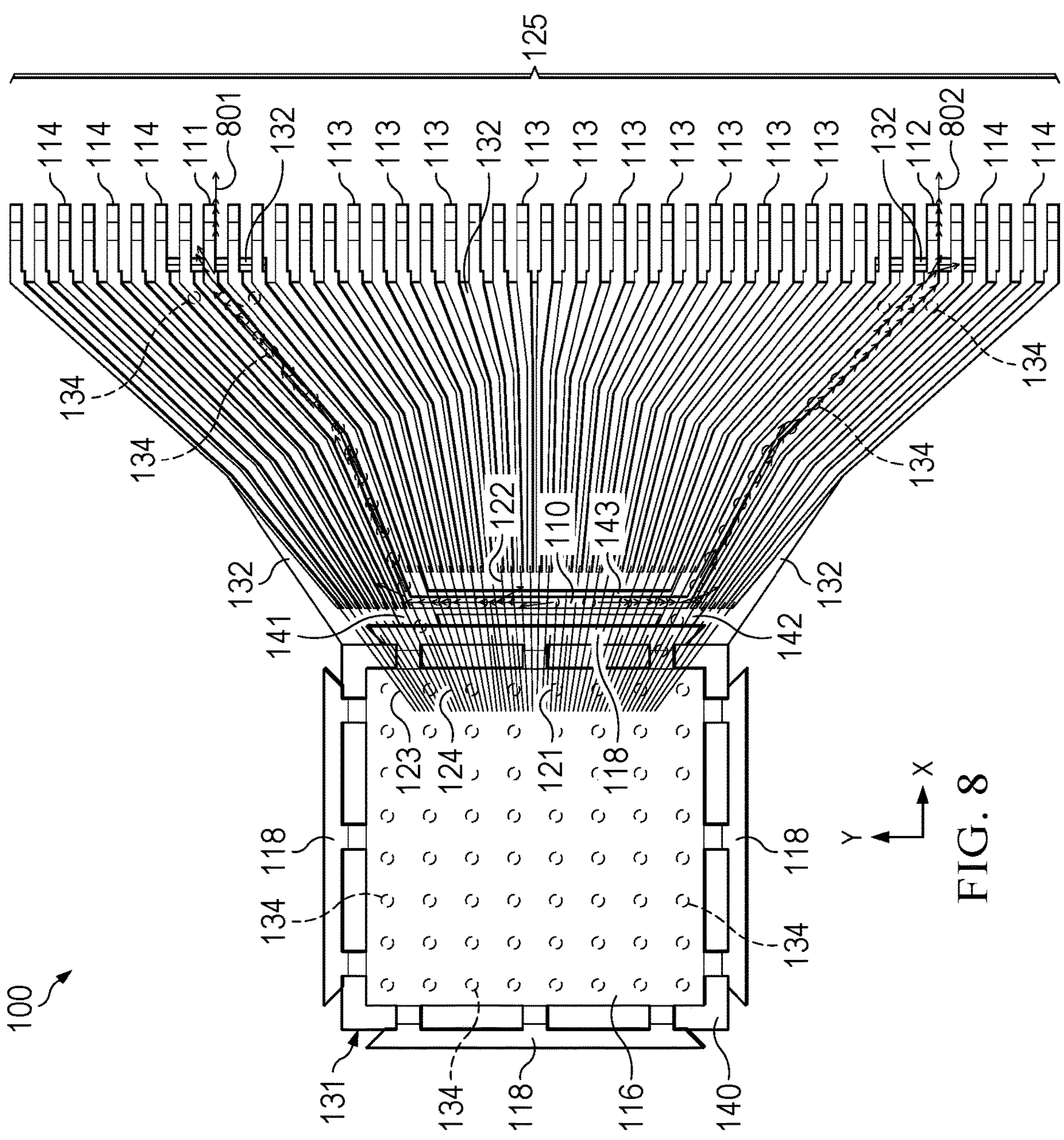
FIG. 8 is a partial top plan view of return current paths in one quadrant of the electronic device along one side in the system of FIG. 1.
Figure 9:
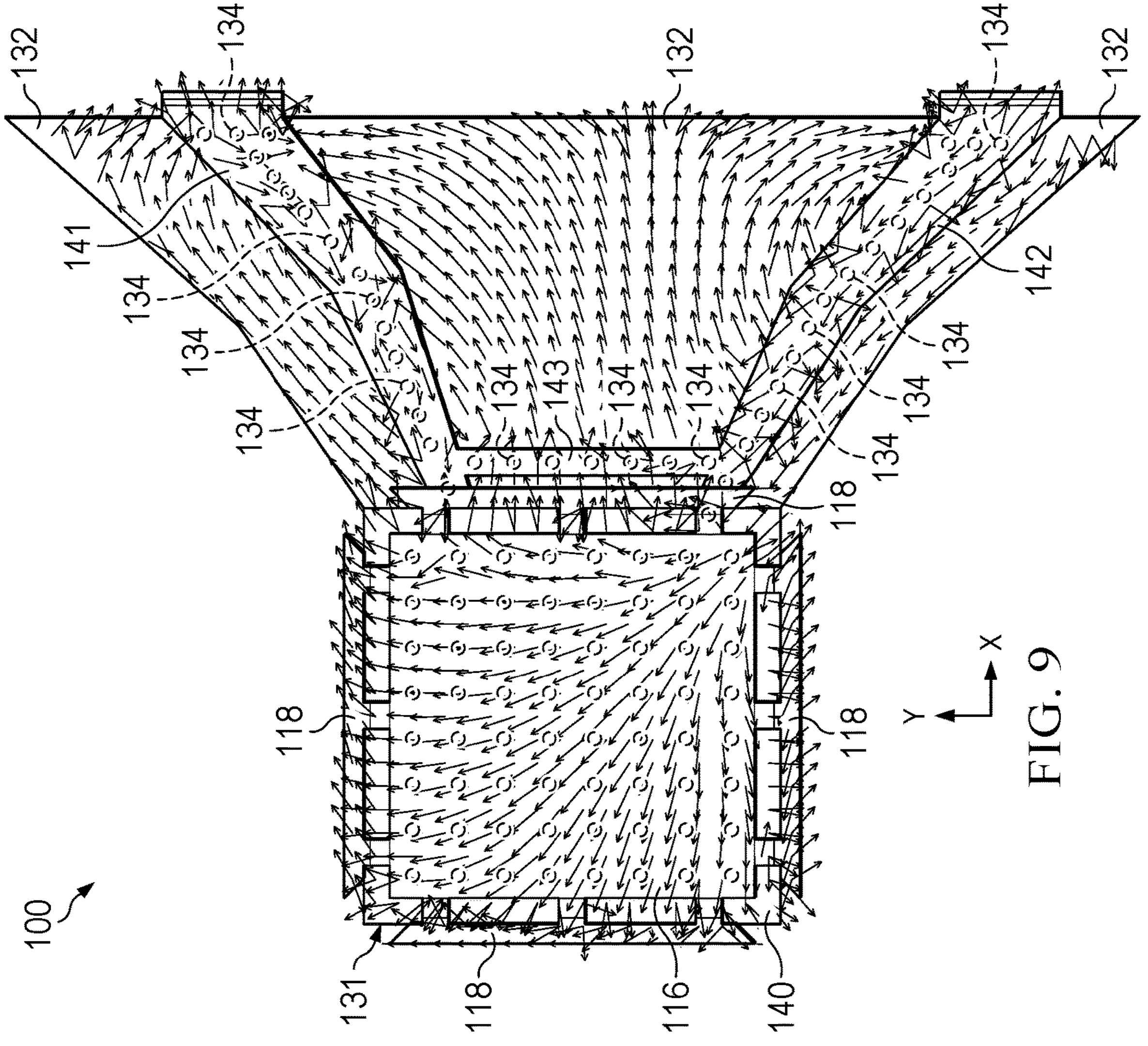
FIG. 9 is a partial top plan view of supply current paths in one quadrant of the electronic device die attach pad and conductive features of the first and second circuit board trace layers in the system of FIG. 1.

FIGS. 8 and 9 illustrate simulated power supply return current paths in one example quadrant of the electronic device 100 of FIGS. 1-1D described above. FIG. 8 shows a partial top view of return current paths 801 and 802 in the example quadrant. The first return current path 801 in this example illustrates current flow from an upper portion of the corresponding crossbar 110 and through the first lead 111 to return current to a power supply (not shown) of the circuit board 130. In this example, the second return current path 802 shows current flow from the lower portion of the crossbar 110 through the second lead 112 in order to return current to the power supply. FIG. 9 shows arrows that indicate simulated return current flow in the respective first and second trace layers 131 and 132 of the circuit board 130, as well as current flow in the die attach pad 116 and the reference connection bars 118.

The described examples facilitate reduced loop inductance in the electronic device 100 and the system including the circuit board 130 by increasing mutual inductance and provide a solution to enhance or maintain pin compatibility and power delivery in a variety of integrated circuit designs, for example, which may have limited space and flexibility. The benefits to the performance of the electronic device 100 can be supplemented and enhanced by system design, including layout of the host circuit board 130 to provide a system level solution for lowered loop inductance, in which the trace layers 131 and 132 are designed in conjunction with the positioning of the non-adjacent and interconnected first and second leads 111 and 112 and the associated crossbars 110 of the electronic device 100. Specific examples include application to high di/dt circuits, such as power traces for power inductance reduction, such as power ground inductance reduction and/or power supply routing inductance reduction. In other implementations, similar benefits can be pursued for other circuits. The described examples, moreover, use empty space that otherwise would not be needed for I/O routing, and can be implemented without adding cost or complexity to the manufacturing processes and equipment. The jump fusing and crossbar interconnection of non-adjacent first and second leads 111 and 112 facilitates I/O interconnections as well as power supply routing without impacting the I/O density of the electronic device or the circuit board 130, and more than one bond wire can be connected between corresponding conductive features of the semiconductor die 120 and the crossbars 110 for return current, supply current, and/or other high di/dt circuits to implement any desired level of current carrying capability in such circuitry. While one or more of the above benefits and advantages may be achieved in specific implementations, the described examples are not limited to systems or devices that achieve these or other benefits or advantages.

Modifications are possible in the described examples, and other implementations are possible, within the scope of the claims.

What is claimed is:

1. An electronic device, comprising:

conductive leads arranged in a row along a side of a package structure and including a conductive first lead, a conductive second lead, and a conductive third lead, a conductive fourth lead, the first and second leads non-adjacent in the row, and the third lead between the first and second leads in the row, and the fourth lead outward of the first or second leads in the row;

a conductive crossbar that electrically connects the first and second leads;

a first bond wire that electrically connects a first conductive feature of a semiconductor die to one of the crossbar, the first lead, and the second lead; and a second bond wire that electrically connects a second conductive feature of the semiconductor die to the third lead; and a third bond wire that electrically connects a third conductive feature of the semiconductor die to the fourth lead.

2. The electronic device of claim 1, wherein the second bond wire extends over the conductive crossbar.

3. The electronic device of claim 2, comprising further conductive leads between the first and second leads in the row.

4. The electronic device of claim 2, comprising:

a fifth lead in the row, the first lead between the third lead and the fifth lead in the row; and a fourth bond wire that electrically connects a third conductive feature of the semiconductor die to the fifth lead.

5. The electronic device of claim 1, comprising further conductive leads between the first and second leads in the row.

6. The electronic device of claim 1, wherein the first lead is between the third lead and the fourth lead in the row.

7. The electronic device of claim 1, wherein:

the conductive crossbar is positioned along a first direction between the semiconductor die and the side of the package structure;

the conductive crossbar extends along a second direction from the first lead to the second lead in the package structure;

the second direction is orthogonal to the first direction; and the side of the package structure extends along the second direction.

8. A system, comprising:

an electronic device, comprising:

conductive leads arranged in a row along a side of a package structure and including a conductive first lead, a conductive second lead, and a conductive third lead, the first and second leads non-adjacent in the row, and the third lead between the first and second leads in the row, a conductive crossbar that electrically connects the first and second leads, a first bond wire that electrically connects a first conductive feature of a semiconductor die to one of the crossbar, the first lead, and the second lead, and a second bond wire that electrically connects a second conductive feature of the semiconductor die to the third lead; and a circuit board having a substrate with a first side to which the electronic device is mounted, and an opposite second side, the circuit board comprising:

a conductive first trace layer on the first side of the substrate and including a base trace, a first trace, a second trace, and a third trace, the base trace extending under the semiconductor die, the first trace extending along the first side under the first lead, the second trace extending under the second lead, and the third trace extending under the conductive crossbar and joining the first and second traces, a conductive second trace layer on the second side of the substrate and extending under the base trace, the first trace, the second trace, and the third trace, and conductive vias extending between and electrically connecting the second trace layer to the base trace, the first trace, the second trace, and the third trace of the first trace layer.

9. The system of claim 8, wherein the second bond wire extends over the conductive crossbar.

10. The system of claim 9, wherein the electronic device comprises further conductive leads between the first and second leads in the row.

11. The system of claim 9, wherein the electronic device comprises:

a fourth lead in the row, the first lead between the third lead and the fourth lead in the row; and a third bond wire that electrically connects a third conductive feature of the semiconductor die to the fourth lead.

12. The system of claim 9, wherein:

the conductive crossbar is positioned along a first direction between the semiconductor die and the side of the package structure;

the conductive crossbar extends along a second direction from the first lead to the second lead in the package structure;

the second direction is orthogonal to the first direction; and the side of the package structure extends along the second direction.

13. The system of claim 12, wherein the electronic device comprises further conductive leads between the first and second leads in the row.

14. The system of claim 12, wherein the electronic device comprises:

a fourth lead in the row, the first lead between the third lead and the fourth lead in the row; and a third bond wire that electrically connects a third conductive feature of the semiconductor die to the fourth lead.

15. The system of claim 8, wherein the electronic device comprises further conductive leads between the first and second leads in the row.

16. The system of claim 8, wherein the electronic device comprises:

a fourth lead in the row, the first lead between the third lead and the fourth lead in the row; and a third bond wire that electrically connects a third conductive feature of the semiconductor die to the fourth lead.

17. The electronic device of claim 1, wherein the third bond wire does not extend over the conductive crossbar.

18. The electronic device of claim 1, where in the third bond wire electrically connects the third conductive feature of the semiconductor die to the fourth lead without extending over the conductive crossbar.

19. The electronic device of claim 1, further including a fourth bond wire that electrically connects a fourth conductive feature of the semiconductor die to the fourth lead, wherein the first lead and the second lead are between the third lead and the fourth leads.

20. The electronic device of claim 19, wherein the third bond wire and the fourth bond wire do not extend over the conductive crossbar.

* * * * *